(12) United States Patent
Reitinger

(10) Patent No.: US 7,271,604 B2
(45) Date of Patent: Sep. 18, 2007

(54) METHOD AND APPARATUS FOR TESTING SEMICONDUCTOR WAFERS BY MEANS OF A TEMPERATURE-REGULATED CHUCK DEVICE

(76) Inventor: Erich Reitinger, Nymphenburger Str. 90 c, Munchen, D-80636 (DE)

( * ) Notice: Subject to any disclaimer, the term of this patent is extended or adjusted under 35 U.S.C. 154(b) by 0 days.

(21) Appl. No.: 11/037,870

(22) Filed: Jan. 18, 2005

(65) Prior Publication Data
US 2006/0158207 A1    Jul. 20, 2006

(30) Foreign Application Priority Data
Jan. 10, 2005    (DE) ................ 10 2005 001 163

(51) Int. Cl.
*G01R 31/02*    (2006.01)
(52) U.S. Cl. .................................. 324/760
(58) Field of Classification Search ............... 324/765, 324/760, 158.1; 165/201, 260, 104.33
See application file for complete search history.

(56) References Cited

U.S. PATENT DOCUMENTS

| | | | |
|---|---|---|---|
| 4,791,364 A | 12/1988 | Kufis et al. | |
| 4,845,426 A | 7/1989 | Nolan et al. | |
| 5,084,671 A | 1/1992 | Miyata et al. | |
| 5,124,639 A | 6/1992 | Carlin et al. | |
| 5,166,607 A * | 11/1992 | Long .......................... | 324/760 |
| 5,775,416 A | 7/1998 | Heimanson et al. | |
| 5,977,785 A * | 11/1999 | Burward-Hoy ............. | 324/760 |
| 6,111,421 A * | 8/2000 | Takahashi et al. .......... | 324/758 |
| 6,366,105 B1 | 4/2002 | Chiang | |
| 6,552,561 B2 | 4/2003 | Olsen et al. | |
| 2002/0011856 A1 | 1/2002 | Huang et al. | |
| 2002/0017916 A1 | 2/2002 | Costello et al. | |
| 2002/0062954 A1 | 5/2002 | Getchel et al. | |

(Continued)

FOREIGN PATENT DOCUMENTS

DE    3536098 A1    4/1987

(Continued)

OTHER PUBLICATIONS

PCT International Search Report for PCT/EP2006/000142 for corresponding PCT Application dated Apr. 19, 2006.

*Primary Examiner*—Ha Tran Nguyen
*Assistant Examiner*—Tung X. Nguyen
(74) *Attorney, Agent, or Firm*—Jennifer L. Skord; Michael G. Johnston; Moore & Van Allen, PLLC

(57) ABSTRACT

The present invention provides a method for testing semiconductor wafers by means of a temperature-regulated chuck device, comprising the following steps: controlling the temperature of the chuck device to a predetermined measurement temperature by means of a heating device having a predefined heating power and a cooling device having a predefined cooling capacity, the heating power being substantially greater than a predefined testing power; laying the rear side of a semiconductor wafer on a supporting side of the temperature-regulated chuck device; placing a probe card on the front side of the semiconductor wafer; testing the semiconductor wafer by impressing the testing power from a testing apparatus into a chip region of the front side of the semiconductor wafer by means of probes of the probe card placed on; reducing the heating power by the amount of the testing power during the testing with a substantially constant cooling capacity. The invention also provides a corresponding apparatus.

14 Claims, 2 Drawing Sheets

U.S. PATENT DOCUMENTS

2002/0186031 A1 12/2002 Pelissier
2004/0036492 A1 2/2004 Gaasch et al.

FOREIGN PATENT DOCUMENTS

| DE | 19983379 T1 | 9/2001 |
| WO | 0106273 A1 | 1/2001 |
| WO | 03027686 A2 | 4/2003 |

* cited by examiner

PRIOR ART

METHOD AND APPARATUS FOR TESTING SEMICONDUCTOR WAFERS BY MEANS OF A TEMPERATURE-REGULATED CHUCK DEVICE

BACKGROUND

1. Field of the Invention

The present invention relates to a method and an apparatus for testing semiconductor wafers by means of a temperature-regulated chuck device.

2. Description of Related Art

As is known, test measurements on semiconductor wafers are typically carried out in a temperature range between −60° C. and +400° C. For the purpose of temperature control, a semiconductor wafer is placed on a prober table or chuck, which is cooled and/or heated in accordance with the desired temperature.

In this case, it is firstly necessary to take care that the temperature of the semiconductor wafer does not fall below the dew point of the surrounding gaseous medium, since otherwise condensation of moisture occurs on the semiconductor wafer surface, or icing, which hampers the test measurements or makes them impossible.

Secondly, in the case of test measurements with a high chip power, the problem arises that, in the region of the current flow, the semiconductor wafer is heated locally on the front side above the temperature of the rear side in contact with the chuck since, because of the finite heat transfer resistance between semiconductor wafer and chuck, the dissipation of heat is delayed. Typically, in the case of electrical powers of over 100 W, a local temperature difference of about 90 K between the front side of the semiconductor wafer and the supporting side of the chuck is obtained. This temperature difference disrupts the test measurement, which in particular is intended to specify the isothermal electrical properties of the circuits integrated in the semiconductor wafer. At the same time, at relatively high powers the chips can be heated above a maximum permitted temperature, which is associated with the risk of electrical failure.

FIG. 2 shows a schematic cross-sectional view of an apparatus disclosed by U.S. Pat. No. 5,010,296 for testing semiconductor wafers by means of a temperature-regulated chuck device.

In FIG. 2, reference symbol 6' designates a chuck device the temperature of which can be regulated. The chuck device 6' is connected to a drive device 7', which can bring about a movement in the vertical direction and the plane. Provided above the chuck device 6' is a probe card 12', which has probes 1', for example in the form of fine needles, which are used for the purpose of making contact with integrated circuits on a semiconductor wafer 30' and carrying out electrical measurements thereon.

Reference symbol 13' designates a test device, by means of which the probes 1' can be driven in accordance with predefined test programmes. Likewise capable of being driven by the test device 13' is the control device 7', in order to connect specific integrated circuits of the semiconductor wafer 30' to the probes 1'.

A gas feed device 8', which is connected to a gas supply device 10', is provided on one side of the chuck device 6'.

On the opposite side of the chuck device 6', a suction line device 9' is provided, which is in turn connected to a suction device 11'. The gas feed device 8' and the suction line device 9' have a relatively flat cross-sectional shape, so that gas can be flushed uniformly over the entire surface of the semiconductor wafer 30'. The gas flush in this known semiconductor wafer testing apparatus is used to transport away contamination particles which are deposited on the surface of the semiconductor wafer as a result of external influences or under the influence of the probes 1'.

The structure of probe cards for testing semiconductor wafers is known from Elektronik, Produktion und Prütftechik [Electronics, Production and Testing Technology], July/August 1982, pages 485 to 487, Positionieren und Kontaktieren von Halbleiterwafern [Positioning and making contact with semiconductor wafers].

EP 0 438 957 B1 discloses a testing apparatus for semiconductor—semiconductor wafers, a large number of temperature sensors being fitted to a chuck device, which register a corresponding temperature distribution on the chuck surface.

EP 0 511 928 B1 discloses a chuck device having a large number of labyrinth channels, through which a fluid for the temperature control of the chuck device is led. As a result of the labyrinthine structure, a high cooling capacity and a homogeneous temperature distribution are achieved.

SUMMARY AND OBJECT

The object of the present invention is to specify a method and an apparatus for testing semiconductor wafers by means of a temperature-regulated chuck device which permit conditioning of the semiconductor wafer.

The method according to the invention, having the features of claim 1, and the corresponding apparatus according to claim 9 have the advantage as compared with the known approach to a solution that, even with a high electrical power, only a very low temperature difference arises between the front side of the semiconductor wafer and the supporting side of the chuck.

The idea on which the present invention is based is that the temperature of the chuck device is controlled to a predetermined measurement temperature by means of a heating device having a predefined heating power and a cooling device having a predefined cooling capacity, the heating power being substantially greater than a predefined testing power. During the testing of the semiconductor wafer by impressing the testing power from a testing apparatus, a reduction in the heating power by the amount of the testing power during testing is carried out with a substantially constant cooling capacity.

This has the advantage of a very fast response of the temperature-regulated chuck device as a reaction to the supply of the testing power.

Advantageous developments and improvements of the relevant subject of the invention will be found in the subclaims.

According to a preferred development, the testing power is predefined by the testing apparatus.

According to a further preferred development, the testing power is predefined while taking account of the signal from a first temperature registering device, which registers the temperature of the chip region during the testing.

According to a further preferred development, the first temperature registering device comprises an infrared thermometer.

According to a further preferred development, the testing power is predefined while taking account of the signals from a second and third temperature registering device, which register the input temperature and the output temperature, respectively, of a fluid supplied to the chuck device by the cooling device for the purpose of cooling during the testing.

According to a further preferred development, the chuck device has an upper region, a central region and a lower region, the upper region having the supporting surface in contact with the rear side of the semiconductor wafer, the central region having the heating device (HE), and the lower region having the cooling device.

According to a further preferred development, a fourth temperature registering device is provided in the upper region, a fifth temperature registering device is provided in the central region and a sixth temperature registering device is provided in the lower region.

According to a further preferred development, the testing power is of the order of magnitude of one to several hundred watts and the heating power is of the order of magnitude of one to several kilowatts.

An exemplary embodiment of the invention is illustrated in the drawings and explained in more detail in the following description.

BRIEF DESCRIPTION OF THE DRAWINGS

In the figures, identical reference symbols designate identical or functionally identical constituent parts.

DETAILED DESCRIPTION

Figure 1:
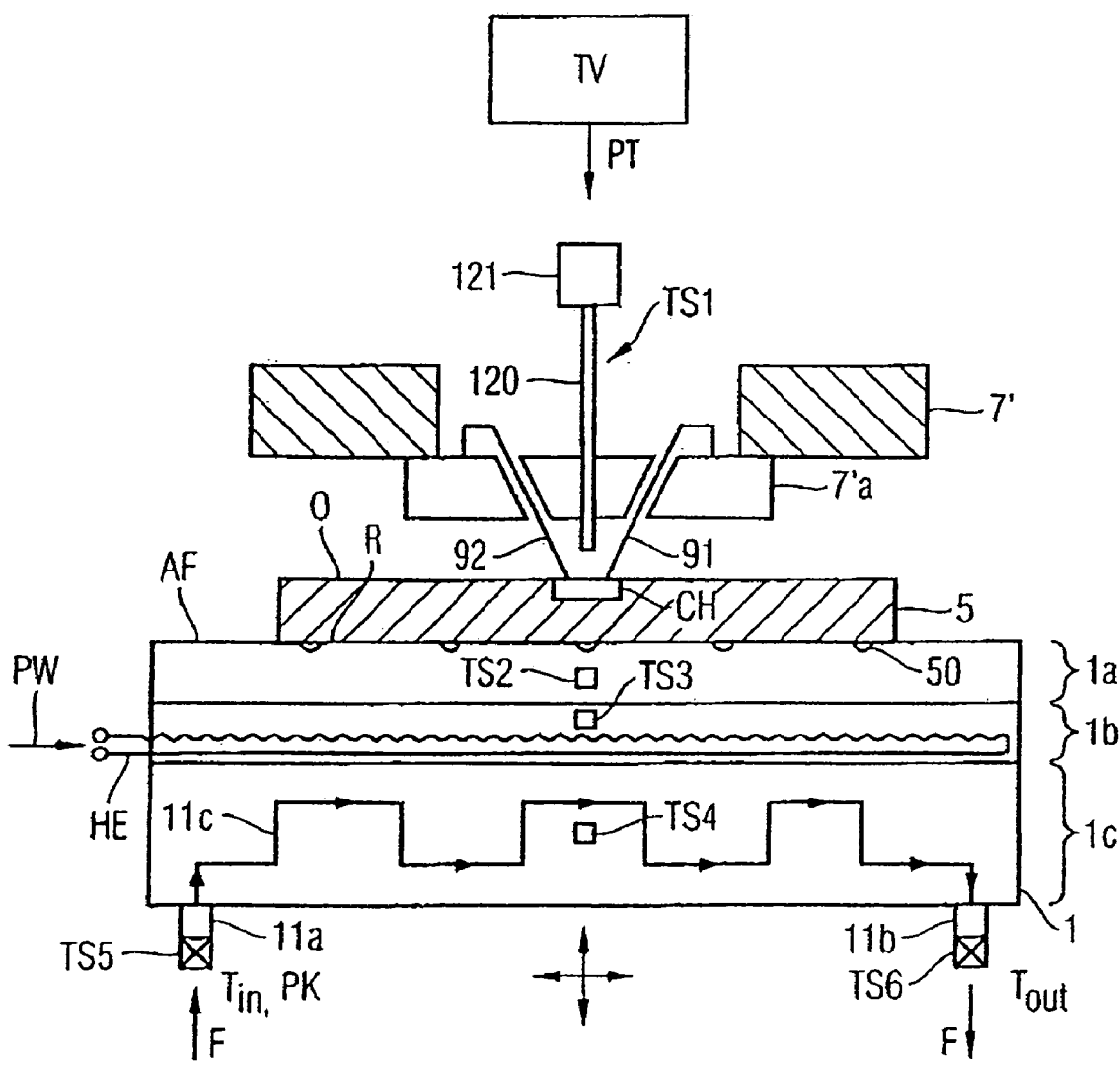
FIG. 1 shows a schematic illustration of an embodiment of the apparatus according to the invention for testing semiconductor wafers by means of a temperature-regulated chuck device.
Figure 2:
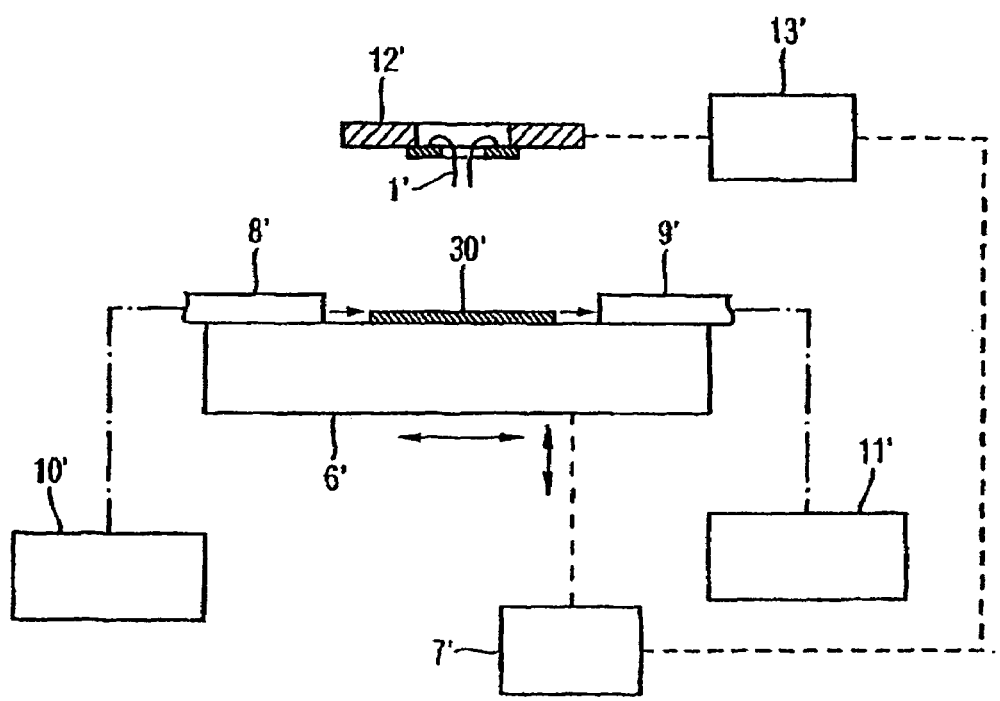
FIG. 2 shows a schematic cross-sectional view of an apparatus disclosed by U.S. Pat. No. 5,010,296 for testing semiconductor wafers by means of a probe card.

FIG. 1 shows a schematic illustration of an embodiment of the apparatus according to the invention for testing semiconductor wafers by means of a temperature-regulated chuck device.

In FIG. 1, reference symbol 1 designates a temperature-regulated chuck device which can be moved in the vertical direction and within the plane.

The chuck device 1 has an upper region 1a, which is provided with vacuum grooves 50. On the upper region 1a of the chuck device 1 there is a semiconductor wafer 5 which makes contact with the supporting side AF of the chuck device 1 with its rear side R.

In a central region 1b of the chuck device 1 there is an electric heating device HE, which is provided to heat up the chuck device 1 by means of supplying electric power PW.

Finally, in the lower region 1c of the chuck device 1 there is a labyrinthine cooling channel system 11c, to which pre-cooled fluid F at an input temperature Tin is supplied at an input 11a and from which this fluid F is removed again at an elevated temperature Tout at an outlet 11b. By means of a temperature control system, not illustrated, the fluid F is brought to a predefined desired temperature outside the chuck device 1.

Above the semiconductor wafer 5 there is a plate-like probe device 7', which has a stepped region 7'a, from which probe needles 91, 92 are placed on a chip region CH on the front side O of the semiconductor wafer 5.

By means of a testing apparatus TV, electrical test sequences are transmitted to the chip region CH via the probes 91, 92, an amount of power PT being fed into the chip region CH, which leads to local heating of the semiconductor chip 5 and has to be cooled away in order to carry out an isothermal test measurement as desired.

In this embodiment according to the invention, various temperature registering devices TS1 to TS6 are provided. A first temperature registering device TS1 is located on the probe device 7' and has an infrared thermometer IR, which comprises an IR optical waveguide 120 and an evaluation circuit 121.

The evaluation device 121 registers the temperature in the chip region CH directly by means of an IR photoconductor (not shown) and an amplifier connected downstream.

A second temperature registering device TS2 is located in the upper region 1a of the chuck device 1, a third temperature registering device TS3 is located in the central region 1b of the chuck device 1, a fourth temperature registering device TS4 is located in the lower region 1c of the chuck device 1, a fifth temperature registering device is located at the inlet 11a for the fluid F, and a sixth temperature registering device TS6 is located at the outlet 11b for the fluid F. Using the temperature registering devices TS2 to TS4, it is in particular possible to determine whether the chuck device 1 is in thermal equilibrium.

Before the test measurement is carried out, with the semiconductor wafer 5 laid on and the probes 91, 92 placed on, the temperature of the chuck device 1 is controlled to a predetermined measurement temperature, for example −20° C., by means of the heating device HE with a predefined heating power PW and the cooling device 11a, 11b, 11c with a predefined cooling capacity PK, the heating power PW being sufficiently greater than a predefined testing power PT, for example PW=1 kW, PT=200 W.

Testing of the semiconductor wafer 5 is then carried out by impressing the testing power PT from the testing apparatus TV into the chip region CH of the front side O of the semiconductor wafer 5 by means of the probes 91, 92 of the probe card 7' placed on.

The testing power PT, which is predefined by the testing apparatus TV, is supplied to a controller (not shown), which, in response thereto, performs a reduction in the heating power PW by the amount of the testing power PT during the testing with a substantially constant cooling capacity PK.

Additionally or alternatively, the testing power PT to be subtracted from the heating power PW can be predefined while taking account of the signal from the first temperature registering device TS1, which registers the temperature of the chip region CH directly without contact during the testing.

Additionally or alternatively, the testing power PT to be subtracted from the heating power PW can be predefined while taking account of the signals from the second and third temperature registering device TS5, TS6, which register the input temperature Tin and the output temperature Tout, respectively, of the fluid F supplied to the chuck device 1 by the cooling device 11a, 11b, 11c for the purpose of cooling during the testing, since its increase in temperature likewise reflects the testing power PT.

Although the present invention has been described above by using preferred exemplary embodiments, it is not restricted thereto but can be modified in many ways.

In particular, the invention is not restricted to gaseous dried air but in principle can be applied to any desired fluids.

What is claimed is:

1. Method for testing semiconductor wafers by means of a temperature-regulated chuck device, comprising the following steps:

controlling a temperature of the chuck device to a predetermined measurement temperature by means of a heating device having a predefined heating power and a cooling device having a predefined cooling capacity, the heating power being substantially greater than a predefined testing power;

laying a rear side of a semiconductor wafer on a supporting side of the temperature-regulated chuck device;

placing a probe card on a front side of the semiconductor wafer;

testing the semiconductor wafer by impressing the testing power from a testing apparatus into a chip region of the front side of the semiconductor wafer by means of probes of the probe card placed thereon;

reducing the heating power by the amount of the testing power during the testing with a substantially constant cooling capacity;

characterized in that the testing power is predefined while taking account of the signals from a second and third temperature registering device, which register the input temperature and the output temperature, respectively, of a fluid supplied to the chuck device by the cooling device for the purpose of cooling during the testing.

2. Method according to claim 1, characterized in that the testing power is predefined by the testing apparatus.

3. Method according to claim 1, characterized in that the testing power is predefined while taking account of a signal from a first temperature registering device, which registers the temperature of the chip region during the testing.

4. Method according to claim 3, characterized in that the temperature registering device comprises an infrared thermometer.

5. Method according to claim 1, characterized in that the chuck device has an upper region, a central region and a lower region, the upper region having the supporting surface in contact with the rear side of the semiconductor wafer, the central region having the heating device, and the lower region having the cooling device.

6. Method according to claim 1, characterized in that the testing power is of the order of magnitude of one to several hundred watts and the heating power is of the order of magnitude of one to several kilowatts.

7. Apparatus according to claim 1, characterized in that the temperature registering device comprises an infrared thermometer.

8. Method for testing semiconductor wafers by means of a temperature-regulated chuck device, comprising the following steps:

controlling a temperature of the chuck device to a predetermined measurement temperature by means of a heating device having a predefined heating power and a cooling device having a predefined cooling capacity, the heating power being substantially greater than a predefined testing power;

laying a rear side of a semiconductor wafer on a supporting side of the temperature-regulated chuck device;

placing a probe card on a front side of the semiconductor wafer;

testing the semiconductor wafer by impressing the testing power from a testing apparatus into a chip region of the front side of the semiconductor wafer by means of probes of the probe card placed thereon;

reducing the heating power by the amount of the testing power during the testing with a substantially constant cooling capacity;

characterized in that the chuck device has an upper region, a central region and a lower region, the upper region having the supporting surface in contact with the rear side of the semiconductor wafer, the central region having the heating device, and the lower region having the cooling device, and a fourth temperature registering device is provided in the upper region, a fifth temperature registering device is provided in the central region and a sixth temperature registering device is provided in the lower region.

9. A method for testing semiconductor wafers, comprising the following steps:

controlling the temperature of a chuck device to a predetermined measurement temperature with an electric heating device having a predefined heating power and a cooling device having a predefined cooling capacity; said heating power being substantially greater than a predefined testing power and a cooling fluid running through said cooling device;

laying the rear side of a semiconductor wafer on a supporting side of said temperature-regulated chuck device;

playing a probe card on a front side of said semiconductor wafer;

testing said semiconductor wafer by impressing said testing power from a testing apparatus into a chip region of said front side of said semiconductor wafer by means of probes of said probe card placed thereon;

detecting a temperature increase of said fluid during said testing; said temperature increase of said fluid reflecting said testing power; and reducing said heating power during said testing with a substantially constant cooling capacity in response to said detected temperature increase of said fluid.

10. The method of claim 9, detecting said temperature increase of said fluid by utilizing detected temperatures of said fluid at an input and an output of said cooling device.

11. The method of claim 9, comprising detecting a temperature increase of said chip region; and reducing said heating power in response to said detected temperature increase of said chip region.

12. The method of claim 11, comprising detecting said temperature increase of said chip region with a temperature registering device which comprises an infrared thermometer.

13. The method of claim 9, wherein said chuck device has an upper region, a central region and a lower region; said upper region comprising said supporting surface in contact with said rear side of said semiconductor wafer, said central region comprising said heating device, and said lower region comprising said cooling device.

14. The method of claim 9, wherein said testing power is of the order of magnitude of one to several hundred watts and said heating power is of the order of magnitude of one to several kilowatts.

* * * * *